United States Patent
Jung (10) Patent No.: US 10,003,335 B2
(45) Date of Patent: Jun. 19, 2018

(54) DATA TRANSMISSION DEVICE, AND SEMICONDUCTOR DEVICE AND SYSTEM INCLUDING THE SAME

(71) Applicant: SK hynix Inc., Icheon-si Gyeonggi-do (KR)

(72) Inventor: Hae Kang Jung, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days. days.

(21) Appl. No.: 15/402,958

(22) Filed: Jan. 10, 2017

(65) Prior Publication Data

US 2018/0062651 A1   Mar. 1, 2018

(30) Foreign Application Priority Data

Aug. 25, 2016   (KR) .................. 10-2016-0108469
Aug. 25, 2016   (KR) .................. 10-2016-0108489

(51) Int. Cl.
*H03K 19/0175* (2006.01)
*H03K 19/00* (2006.01)
*H03K 19/003* (2006.01)
*H03K 17/687* (2006.01)

(52) U.S. Cl.
CPC ....... *H03K 19/0005* (2013.01); *H03K 17/687* (2013.01); *H03K 19/00384* (2013.01); *H03K 19/017509* (2013.01); *H03K 19/017545* (2013.01)

(58) Field of Classification Search
CPC ....... H03K 19/0005; H03K 19/018521; H03K 19/00384; H03K 17/145; H03K 17/6871; H03K 17/6872; H03K 19/0027; H03K 19/00361; H03K 19/018557; G11C 2207/2254; G11C 7/1057; G11C 7/1051; G11C 29/028; G11C 29/022; G11C 5/147; G11C 29/50008; G11C 7/1069; G11C 11/4096; G11C 29/02

See application file for complete search history.

(56) References Cited

U.S. PATENT DOCUMENTS

| | | | | |
|---|---|---|---|---|
| 7,825,682 B1 | 11/2010 | Wang et al. | | |
| 7,843,211 B2 * | 11/2010 | Kim | .............. | G11C 5/063 326/30 |
| 7,940,078 B2 * | 5/2011 | Pan | .............. | H03K 19/0005 326/30 |
| 8,199,591 B2 * | 6/2012 | Lee | .............. | G11C 7/1051 365/198 |
| 8,553,471 B2 * | 10/2013 | Kim | .............. | G11C 7/1057 365/189.05 |
| 8,773,161 B2 * | 7/2014 | Moon | .............. | G11C 5/063 326/101 |

(Continued)

FOREIGN PATENT DOCUMENTS

KR   1020090108291 A       10/2009
KR   20120033440 A   *   4/2012

*Primary Examiner* — Vibol Tan
(74) *Attorney, Agent, or Firm* — William Park & Associates Ltd.

(57) ABSTRACT

A data transmission device may include a calibration circuit and an output driver. The calibration circuit may generate a pull-up calibration voltage and a pull-down calibration voltage. The resistance value of the output driver may be changed based on the pull-up calibration voltage and the pull-down calibration voltage.

28 Claims, 7 Drawing Sheets

(56) References Cited

U.S. PATENT DOCUMENTS

| | | | |
|---|---|---|---|
| 9,344,088 B1* | 5/2016 | Sanchez | H03K 19/01852 |
| 9,368,234 B2* | 6/2016 | Kang | G11C 29/50008 |
| 2006/0017457 A1* | 1/2006 | Pan | H03K 19/00384 |
| | | | 326/32 |
| 2011/0267112 A1* | 11/2011 | Lee | H03K 19/01852 |
| | | | 327/108 |
| 2012/0007632 A1* | 1/2012 | Kang | G11C 7/04 |
| | | | 326/30 |
| 2012/0099383 A1* | 4/2012 | Kim | G11C 7/1057 |
| | | | 365/189.02 |
| 2012/0169380 A1* | 7/2012 | Kang | G11C 7/1051 |
| | | | 327/108 |
| 2012/0243345 A1* | 9/2012 | Matsuoka | G11C 7/1057 |
| | | | 365/189.011 |
| 2015/0270010 A1* | 9/2015 | Kang | G11C 29/022 |
| | | | 365/185.22 |
| 2015/0333753 A1* | 11/2015 | Chen | H03K 19/0027 |
| | | | 326/30 |
| 2016/0365851 A1* | 12/2016 | Lee | H03K 19/0185 |

* cited by examiner

DATA TRANSMISSION DEVICE, AND SEMICONDUCTOR DEVICE AND SYSTEM INCLUDING THE SAME

CROSS-REFERENCES TO RELATED APPLICATION

The present application claims priority under 35 U.S.C. § 119(a) to Korean application number 10-2016-0108469 and 10-2016-0108489 filed on Aug. 25, 2016, in the Korean Intellectual Property Office, which is incorporated herein by reference in its entirety.

BACKGROUND

1. Technical Field

Various embodiments generally relate to a semiconductor technology, and, more particularly, to a data transmission device, and a semiconductor device and system including the same.

2. Related Art

Each electronic apparatus may include a large number of electronic components. Among the electronic apparatuses, a computer system may include many electronic components that are implemented on semiconductor integrated circuits. A semiconductor device used in the computer system may include a data transmission circuit to receive/transmit data from/to another electronic component. High-speed, low-power semiconductor devices require controlled impedance values for signal integrity purposes. Signal reflection associated with an impedance mismatch between semiconductor devices communicating with each other may cause signal distortion. Therefore, it is necessary to have a termination circuit for impedance matching in transmission lines.

The electronic apparatus may have the termination circuit inside the semiconductor devices (e.g., on-die termination circuit) instead of having it outside the semiconductor devices. The semiconductor device may have a circuit for calibrating termination resistors according to PVT variations to provide a precise impedance matching. A semiconductor memory device may be coupled to an external reference resistor, and may calibrate the impedance value of the termination resistors by performing a ZQ calibration operation by using the external reference resistor.

SUMMARY

In an embodiment, a data transmission device may include a calibration circuit and an output driver. The calibration circuit may perform a calibration operation, and may generate a pull-up calibration voltage and a pull-down calibration voltage. The output driver may drive a data transmission line based on the pull-up calibration voltage, the pull-down calibration voltage, and data.

In an embodiment, a data transmission device may include an output driver including a pull-up resistor, a pull-down resistor, and a data driver. The pull-up resistor may be coupled to a power supply voltage, and may have a resistance value that is changed based on a pull-up calibration voltage. The pull-down resistor may be coupled to a low voltage, and may have a resistance value that is changed based on a pull-down calibration voltage. The data driver may be coupled between the pull-up resistor and the pull-down resistor, and may drive a data transmission line based on data.

In an embodiment, a data transmission device may include a calibration circuit and an output driver. The calibration circuit may generate a pull-up calibration code and a pull-down calibration code by performing a calibration operation, and may generate a level shifted pull-up calibration code and a level shifted pull-down calibration code by level shifting the pull-up calibration code and the pull-down calibration code. The output driver may drive a data transmission line based on the level shifted pull-up calibration code, the level shifted pull-down calibration code, and data.

In an embodiment, a data transmission device may include an output driver including a pull-up resistor leg, a pull-down resistor leg, and a data driver. The pull-up resistor leg may be coupled to a power supply voltage, and may have a resistance value that is changed based on a level shifted pull-up calibration code. The pull-down resistor leg may be coupled to a low voltage, and may have a resistance value that is changed based on a level shifted pull-down calibration code. The data driver may be coupled between the pull-up resistor leg and the pull-down resistance leg, and may drive a data transmission line based on data.

DETAILED DESCRIPTION

Hereinafter, a data transmission device, and a semiconductor device and system including the same will be described below with reference to the accompanying drawings through various examples of embodiments.

Figure 1:
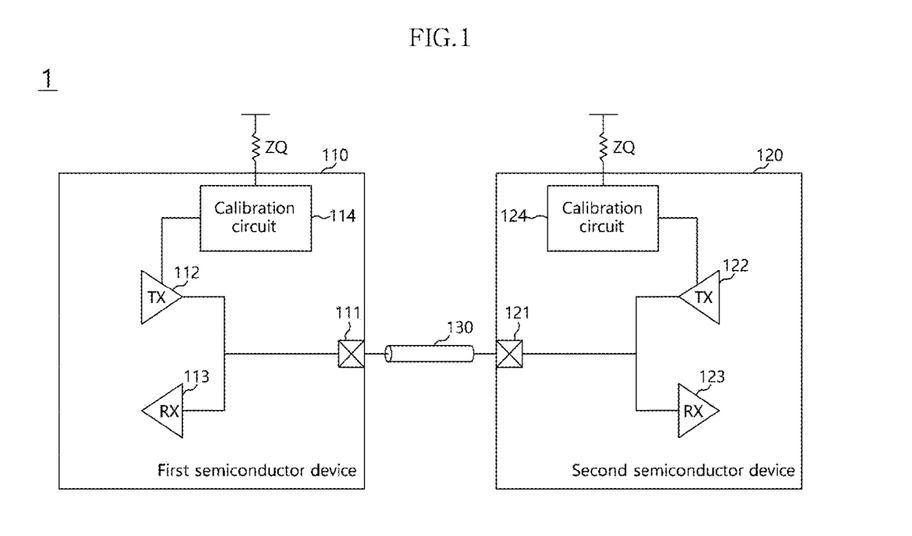
FIG. 1 is a diagram illustrating an example configuration of a semiconductor system in accordance with an embodiment.

FIG. 1 is a diagram illustrating an example configuration of a semiconductor system 1 in accordance with an embodiment. In FIG. 1, the semiconductor system 1 in accordance with an embodiment may include a first semiconductor device 110 and a second semiconductor device 120. The first semiconductor device 110 and the second semiconductor device 120 may be electronic components that communicate with each other. In an embodiment, the first semiconductor device 110 may be a master device, and the second semiconductor device 120 may be a slave device over which the first semiconductor device 110 has control. For example, the first semiconductor device 110 may be a host device such as a processor or a controller. Examples of the first semiconductor device 110 may include a central processing unit (CPU), a graphic processing unit (GPU), a multimedia processor (MMP), a digital signal processor (DSP), and a memory controller. Furthermore, the first semiconductor device 110 may be realized in the form of a system-on-chip by combining processor chips having various functions, such as application processors (AP). The second semiconductor device 120 may be a memory device. Examples of the memory device may include a volatile memory such as a static RAM (SRAM), a dynamic RAM (DRAM), and a synchronous DRAM (SDRAM), and a nonvolatile memory such as a read only memory (ROM), a programmable ROM (PROM), an electrically erasable and programmable ROM (EEPROM), an electrically programmable ROM (EPROM), a flash memory, a phase change RAM (PRAM), a magnetic RAM (MRAM), a resistive RAM (RRAM), and a ferroelectric RAM (FRAM).

The first and second semiconductor devices 110 and 120 may be coupled to each other through a data transmission line 130. The first semiconductor device 110 may include a data pad 111, and the data pad 111 may be coupled to the data transmission line 130. The second semiconductor device 120 may include a data pad 121, which may be coupled to the data transmission line 130. The data transmission line 130 may be a channel, a link, or a bus. The first semiconductor device 110 may include a data transmission device 112 and a data reception device 113. The data transmission device 112 may generate output data according to internal data of the first semiconductor device 110 (e.g., data stored in the first semiconductor device 110), and may transmit the output data to the second semiconductor device 120 through the data transmission line 130. The data reception device 113 may receive the data transmitted from the second semiconductor device 120 through the data transmission line 130, and may generate internal data. Similarly, the second semiconductor device 120 may include a data transmission device 122 and a data reception device 123. The data transmission device 122 may generate output data according to the internal data of the second semiconductor device 120, and may transmit the output data to the first semiconductor device 110 through the data transmission line 130. The data reception device 123 may receive the data transmitted from the first semiconductor device 110 through the data transmission line 130, and may generate internal data.

The first and second semiconductor devices 110 and 120 may further include calibration circuits 114 and 124. The calibration circuits 114 and 124 may be coupled to external reference resistors ZQ, and may perform calibration operations. The calibration circuits 114 and 124 may set the resistance values of the data transmission devices 112 and 122 through the calibration operations. For example, the resistance values of the data transmission devices 112 and 122 may be set to 60 ohms, 120 ohms, or 240 ohms depending on results of the calibration operations.

Figure 2:
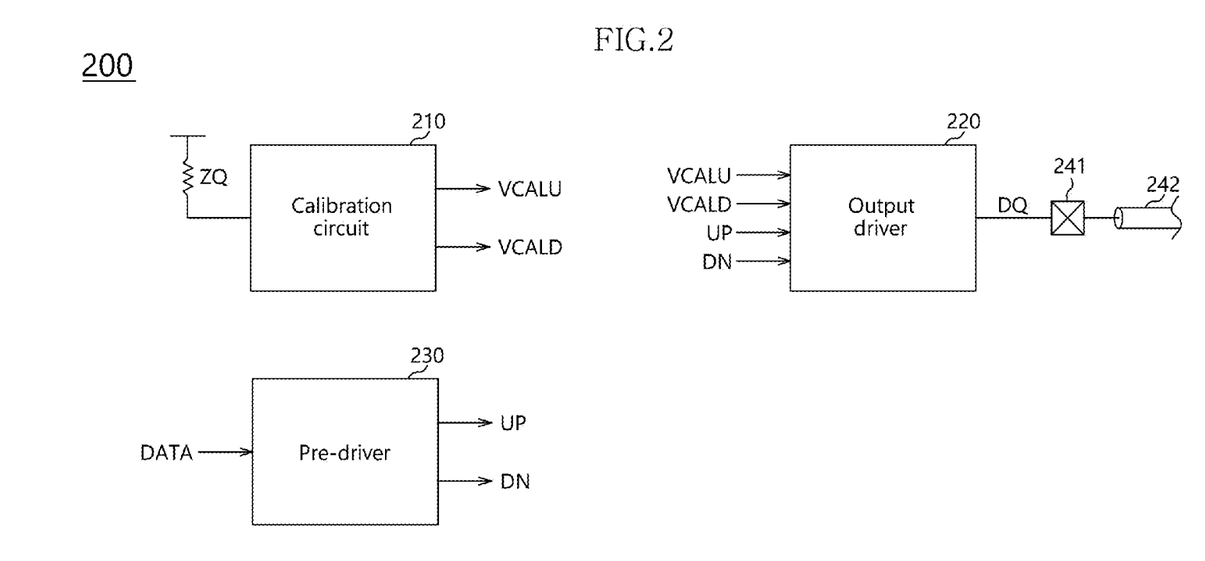
FIG. 2 is a diagram illustrating an example configuration of a data transmission device in accordance with an embodiment.

FIG. 2 is a diagram illustrating an example configuration of a data transmission device 200 in accordance with an embodiment. In FIG. 2, the data transmission device 200 may include a calibration circuit 210 and an output driver 220. The calibration circuit 210 may be coupled to an external reference resistor ZQ, and may perform a calibration operation. The calibration circuit 210 may set the resistance value of the output driver 220 based on a result of the calibration operation. The calibration circuit 210 may generate a pull-up calibration voltage VCALU and a pull-down calibration voltage VCALD through the calibration operation. The pull-up calibration voltage VCALU and the pull-down calibration voltage VCALD may be analog voltages.

Resistance values of resistors of the output driver 220 may be set based on the pull-up calibration voltage VCALU and the pull-down calibration voltage VCALD. The pull-up resistance value (e.g., resistance values of pull-up resistors) of the output driver 220 may be set based on the pull-up calibration voltage VCALU, and the pull-down resistance value (e.g., resistance values of pull-down resistors) of the output driver 220 may be set based on the pull-down calibration voltage VCALD. The output driver 220 may generate output data DQ based on data DATA. The output driver 220 may generate the output data DQ based on an up signal UP and a down signal DN, which are generated based on the data DATA. The output driver 220 may be coupled to a data transmission line 242 through a data pad 241. The output driver 220 may transmit the output data DQ through the data transmission line 242, by driving the data transmission line 242 based on the up signal UP and the down signal DN. The output driver 220 may pull-up drive the data transmission line 242 based on the up signal UP, and pull-down drive the data transmission line 242 based on the down signal DN.

In FIG. 2, the data transmission device 200 may further include a pre-driver 230. The pre-driver 230 may generate the up signal UP and the down signal DN in response to the data signal DATA. For example, the pre-driver 230 may enable the up signal UP when the data signal DATA is at a high level, and enable the down signal DN when the data signal DATA is at a low level. The pre-driver 230 may contain a logic circuit element capable of enabling selectively the up signal UP and the down signal DN depending on the voltage level of the data signal DATA.

Figure 3:
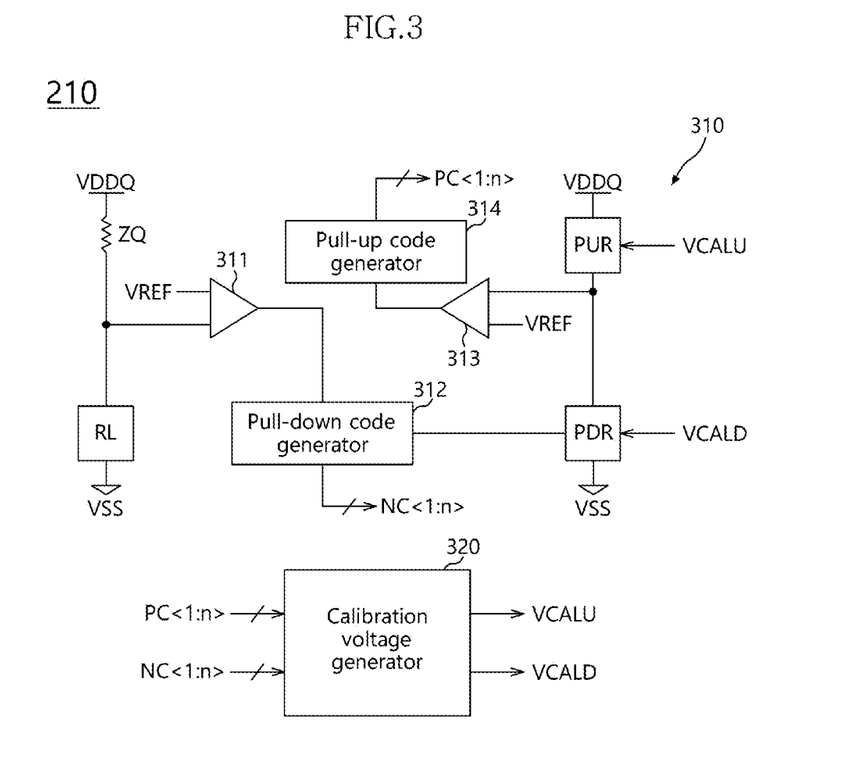
FIG. 3 is a diagram illustrating an example configuration of the calibration circuit illustrated in FIG. 2.

FIG. 3 is a diagram illustrating an example configuration of the calibration circuit 210 illustrated in FIG. 2. In FIG. 3, the calibration circuit 210 may include a calibration code generator 310 and a calibration voltage generator 320. The calibration code generator 310 may be coupled to the external reference resistor ZQ, and may generate a pull-up calibration code PC<1:n> (n is an integer equal to or greater than 2) and a pull-down calibration code NC<1:n>. Each of the pull-up calibration code PC<1:n> and the pull-down calibration code NC<1:n> may be a digital code consisting of a plurality of binary bits. The calibration voltage generator 320 may receive the pull-up calibration code PC<1:n> and the pull-down calibration code NC<1:n>, and may generate the pull-up calibration voltage VCALU and the pull-down calibration voltage VCALD. The calibration voltage generator 320 may include, for example, a digital-to-analog converter (DAC). The calibration voltage generator 320 may generate the pull-up calibration voltage VCALU having an analog voltage level based on the pull-up calibration code PC<1:n>, which is a digital code signal. Similarly, the calibration voltage generator 320 may generate the pull-down calibration voltage VCALD having an analog voltage level based on the pull-down calibration code NC<1:n>, which is a digital code signal. The pull-up calibration voltage VCALU and the pull-down calibration voltage VCALD may have any voltage level between a ground voltage VSS and a high voltage. The features of the high voltage will be discussed later.

In FIG. 3, the calibration code generator 310 may include a reference resistor leg RL, a first comparator 311, a pull-down code generator 312, a pull-down resistor PDR, a pull-up resistor PUR, a second comparator 313, and a pull-up code generator 314. The reference resistor leg RL may be coupled to the external reference resistor ZQ. The external reference resistor ZQ may be coupled to a power supply voltage VDDQ, and the reference resistor leg RL may be, for example, a pull-down resistor coupled to the ground voltage VSS. In an embodiment, the external reference resistor ZQ may be coupled to the ground voltage VSS, and the reference resistor leg RL may be, for example, a pull-up resistor coupled to the power supply voltage VDDQ. The first comparator 311 may compare a voltage level determined according to a resistance ratio of the external reference resistor ZQ and the reference resistor leg RL and a voltage level of a reference voltage VREF. The reference voltage VREF may have a voltage level corresponding to half the voltage level of the power supply voltage VDDQ of the calibration circuit 210. The pull-down code generator 312 may generate the pull-down calibration code NC<1:n> based on the comparison result of the first comparator 311. For example, the pull-down code generator 312 may increase or decrease the value of the pull-down calibration code NC<1:n> according to the comparison result of the first comparator 311. The pull-down resistor PDR may have a resistance value that can be changed based on the pull-down calibration voltage VCALD.

The pull-up resistor PUR may be coupled to the pull-down resistor PDR. The second comparator 313 may compare a voltage level according to the resistance ratio of the pull-up resistor PUR and the pull-down resistor PDR and a voltage level of the reference voltage VREF. The pull-up code generator 314 may generate the pull-up calibration code PC<1:n> according to the comparison result of the second comparator 313. For example, the pull-up code generator 314 may increase or decrease the value of the pull-up calibration code PC<1:n> according to the comparison result of the second comparator 313. The pull-up resistor PUR may have a resistance value that can be changed based on the pull-up calibration voltage VCALU. The calibration code generator 310 may set first the pull-up calibration code PC<1:n>, and then may set the pull-down calibration code NC<1:n> according to the set pull-up calibration code PC<1:n>. Alternatively, the calibration code generator 310 may set first the pull-down calibration code NC<1:n>, and then may set the pull-up calibration code PC<1:n> according to the set pull-down calibration code NC<1:n>.

Figure 4:
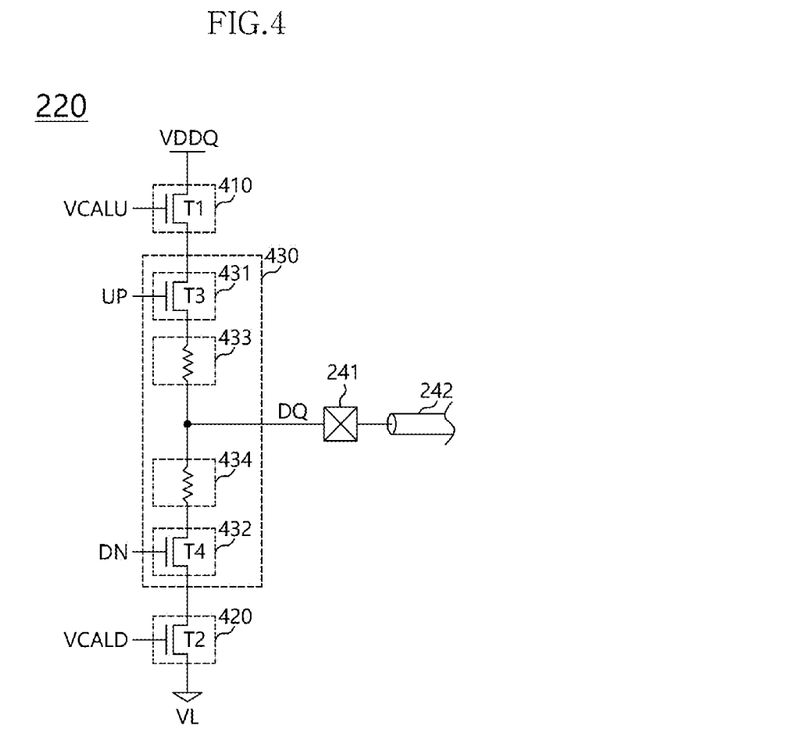
FIG. 4 is a diagram illustrating an example configuration of the output driver illustrated in FIG. 2.

FIG. 4 is a diagram illustrating an example configuration of the output driver 220 illustrated in FIG. 2. The output driver 220 may generate the output data DQ by driving the data transmission line 242 based on the data DATA. The output driver 220 may operate by using the power supply voltage VDDQ, and may generate the output data DQ having a voltage level between the power supply voltage VDDQ and a low voltage VL. The output driver 220 may use the same power supply voltage VDDQ as the calibration circuit 210. The low voltage VL may be, for example, the ground voltage VSS. The pull-up calibration voltage VCALU and the pull-down calibration voltage VCALD may have voltage levels between the high voltage and the low voltage VL. Here, the high voltage may have a voltage level higher than the power supply voltage VDDQ of the output driver 220. The resistance value of the output driver 220 may be set based on the pull-up calibration voltage VCALU and the pull-down calibration voltage VCALD. In FIG. 4, the output driver 220 may include a pull-up resistor 410, a pull-down resistor 420, and a data driver 430. The pull-up resistor 410 may be coupled between a terminal of the power supply voltage VDDQ and the data driver 430. The pull-up resistor 410 may have a resistance value that can be changed based on the pull-up calibration voltage VCALU. The pull-up resistor 410 may be configured in substantially the same way as the pull-up resistor PUR of FIG. 3. That is to say, the pull-up resistor PUR may be a replica resistor of the pull-up resistor 410. The pull-down resistor 420 may be coupled between the terminal of the low voltage VL and the data driver 430. The pull-down resistor 420 may have a resistance value that can be changed based on the pull-down calibration voltage VCALD. The pull-down resistor 420 may be configured in substantially the same way as the pull-down resistor PDR of FIG. 3. That is to say, the pull-down resistor PDR may be a replica resistor of the pull-down resistor 420.

The data driver 430 may be coupled to the data transmission line 242 through the data pad 241, and may be coupled between the pull-up resistor 410 and the pull-down resistor 420. The data driver 430 may drive the data transmission line 242 based on the data DATA. The data driver 430 may generate the output data DQ by driving the data transmission line 242. The data driver 430 may pull-up or pull-down the data transmission line 242, based on the up signal UP and the down signal DN which are generated based on the data DATA. The data driver 430 may include a pull-up driver 431 and a pull-down driver 432. The pull-up driver 431 may be coupled between the pull-up resistor 410 and the data transmission line 242. The pull-up driver 431 may pull the data transmission line 242 to a higher voltage when the up signal UP is enabled. The pull-down driver 432 may be coupled between the data transmission line 242 and the pull-down resistor 420. The pull-down driver 432 may pull the data transmission line 242 to a lower voltage when the down signal DN is enabled.

In FIG. 4, the data driver 430 may further include a first resistor element 433 and a second resistor element 434. The first resistor element 433 may be coupled between the pull-up driver 431 and the data transmission line 242. The first resistor element 433 may be coupled to the data pad 241. The second resistor element 434 may be coupled between the data transmission line 242 and the pull-down driver 432. The second resistor element 434 may be coupled to the data pad 241. The first resistor element 433 and the second resistor element 434 may be provided for electrostatic discharge (ESD) purposes.

In FIG. 4, the pull-up resistor 410 may include a first transistor T1. The first transistor T1 may be an N-channel MOS transistor. The first transistor T1 may receive the pull-up calibration voltage VCALU through a gate thereof and receive the power supply voltage VDDQ through a drain thereof. A source of the first transistor T1 may be coupled to the pull-up driver 431. The pull-down resistor 420 may include a second transistor T2. The second transistor T2 may be an N-channel MOS transistor. The second transistor T2 may receive the pull-down calibration voltage VCALD through a gate thereof. A drain of the second transistor T2 may be coupled to the pull-down driver 432, and a source of the second transistor T2 may be coupled to the low voltage VL. The first and second transistors T1 and T2 may have resistance values that can be changed depending on the levels of the voltages received through the gates thereof. Since the pull-up resistor 410 and the pull-down resistor 420 receive the pull-up calibration voltage VCALU and the pull-down calibration voltage VCALD each having analog voltages, the pull-up resistor 410 and the pull-down resistor 420, each of which has one transistor, may perform necessary operations even in the absence of a plurality of resistor legs. Accordingly, the output driver 220 in accordance with an embodiment may be reduced in size, and may allow quick and precise operation.

The pull-up driver 431 may include a third transistor T3. The third transistor T3 may be an N-channel MOS transistor. The third transistor T3 may receive the up signal UP through a gate thereof. A drain of the third transistor T3 may be coupled to the source of the first transistor T1 through the drain, and a source of the third transistor T3 may be coupled to the first resistor element 433. The pull-down driver 432 may include a fourth transistor T4. The fourth transistor T4 may be an N-channel MOS transistor. The fourth transistor T4 may receive the down signal DN through a gate thereof. A drain of the fourth transistor T4 may be coupled to the second resistor element 434, and a source of the fourth transistor T4 may be coupled to the drain of the second transistor T2. In an embodiment of the present disclosure, the third and fourth transistors T3 and T4 may have a size smaller than the first and second transistors T1 and T2. The data transmission line 242 may be coupled to the pull-up resistor 410 and the pull-down resistor 420 through the pull-up driver 431 and the pull-down driver 432, instead of being coupled directly to the pull-up resistor 410 and the pull-down resistor 420. Therefore, the data transmission line 242 does not see a high impedance. Thus, it is possible to drive the data transmission line 242 with a relatively low driving force, and the size of the third and fourth transistors T3 and T4 forming the pull-up driver 431 and the pull-down driver 432 may decrease. As a consequence, the output driver 220 may decrease in size by having the pull-up resistor 410, the pull-up driver 431, the pull-down driver 432, and the pull-down resistor 420, which are coupled between the power supply voltage VDDQ and the low voltage VL.

Figure 5:
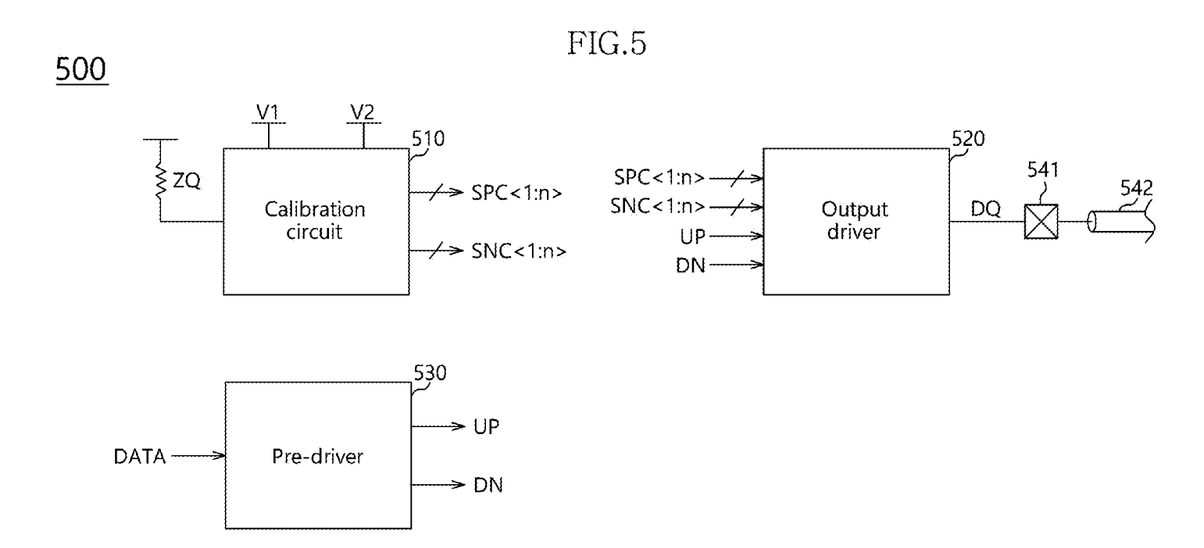
FIG. 5 is a diagram illustrating an example configuration of a data transmission device in accordance with an embodiment.

FIG. 5 is a diagram illustrating an example configuration of a data transmission device 500 in accordance with an embodiment. In FIG. 5, the data transmission device 500 may include a calibration circuit 510 and an output driver 520. The calibration circuit 510 may be coupled to an external reference resistor ZQ, and may perform a calibration operation. The calibration circuit 510 may set the resistance value of the output driver 520 based on a result of the calibration operation. The calibration circuit 510 may generate a pull-up calibration code and a pull-down calibration code through the calibration operation, and may generate a level shifted pull-up calibration code SPC<1:n> and a level shifted pull-down calibration code SNC<1:n> by level shifting the pull-up calibration code and the pull-down calibration code. For example, each of the pull-up calibration code and the pull-down calibration code may include a plurality of binary bits, and a voltage level corresponding to a logic high level may be a first high voltage V1. The calibration circuit 510 may generate the level shifted pull-up calibration code SPC<1:n> and the level shifted pull-down calibration code SNC<1:n> by level shifting the voltage level corresponding to a logic high level, to a second high voltage V2. The second high voltage V2 may have a level higher than the first high voltage V1.

Resistance values of the output driver 520 may be set based on the level shifted pull-up calibration code SPC<1:n> and the level shifted pull-down calibration code SNC<1:n>. The output driver 520 may generate output data DQ based on data DATA. The pull-up resistance value of the output driver 520 may be set based on the level shifted pull-up calibration code SPC<1:n>, and the pull-down resistance value of the output driver 520 may be set based on the level shifted pull-down calibration code SNC<1:n>. The output driver 520 may generate the output data DQ based on an up signal UP and a down signal DN which are generated based on the data DATA. The output driver 520 may be coupled to a data transmission line 542 through a data pad 541. The output driver 520 may transmit the output data DQ through the data transmission line 542, by driving the data transmission line 542 based on the up signal UP and the down signal DN. The output driver 520 may pull the data transmission line 542 to a higher voltage based on the up signal UP, and pull the data transmission line 542 to a lower voltage based on the down signal DN.

In FIG. 5, the data transmission device 500 may further include a pre-driver 530. The pre-driver 530 may generate the up signal UP and the down signal DN in response to the data signal DATA. For example, the pre-driver 530 may enable the up signal UP when the data signal DATA is at a high level, and enable the down signal DN when the data signal DATA is at a low level. The pre-driver 530 may contain a logic circuit element capable of enabling selectively the up signal UP and the down signal DN depending on the voltage level of the data signal DATA.

Figure 6:
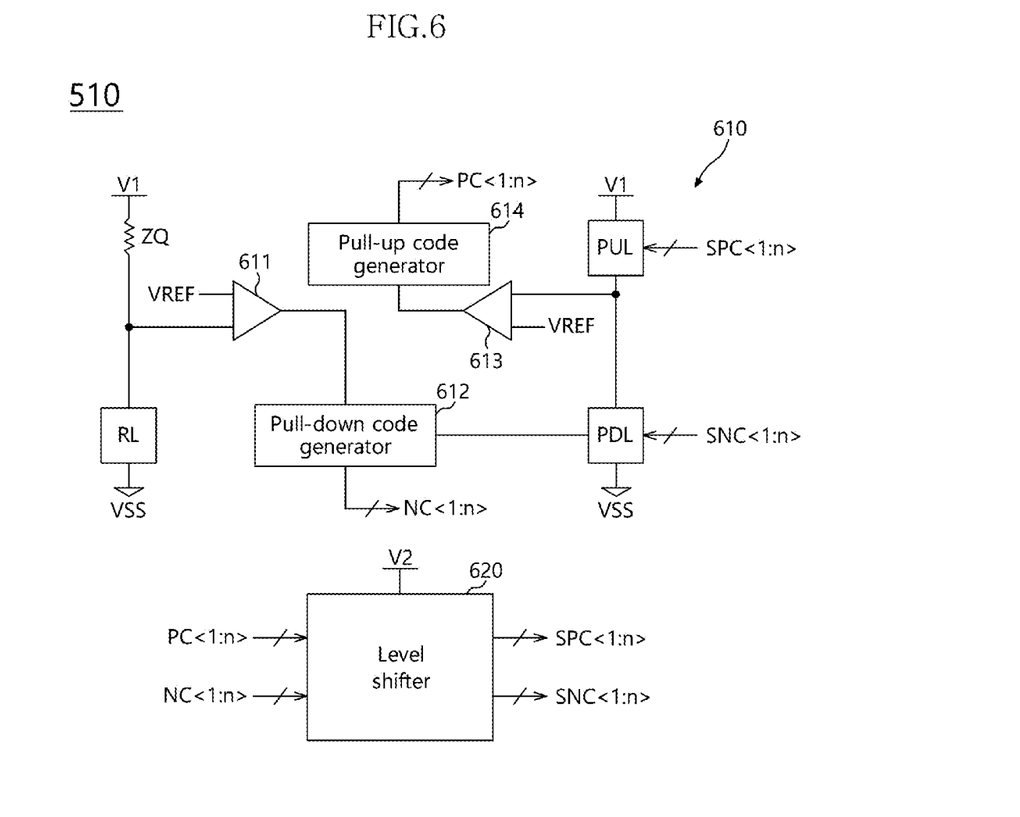
FIG. 6 is a diagram illustrating an example configuration of the calibration circuit illustrated in FIG. 5.

FIG. 6 is a diagram illustrating an example configuration of the calibration circuit 510 illustrated in FIG. 5. In FIG. 6, the calibration circuit 510 may include a calibration code generator 610 and a level shifter 620. The calibration code generator 610 may be coupled to the external reference resistor ZQ, and may generate a pull-up calibration code PC<1:n> and a pull-down calibration code NC<1:n>. Each of the pull-up calibration code PC<1:n> and the pull-down calibration code NC<1:n> may be a digital code consisting of a plurality of binary bits. The level shifter 620 may receive the pull-up calibration code PC<1:n> and the pull-down calibration code NC<1:n>, and may generate the level shifted pull-up calibration code SPC<1:n> and the level shifted pull-down calibration code SNC<1:n>. Here, each of the pull-up calibration code PC<1:n> and the pull-down calibration code NC<1:n> may be a digital code consisting of a plurality of binary bits, a logic high value (i.e., logic "1" value) of which is represented by the first high voltage V1. In an embodiment, the level shifter 620 may level shift the pull-up calibration code PC<1:n> and the pull-down calibration code NC<1:n>, and generate the level shifted pull-up calibration code SPC<1:n> and the level shifted pull-down calibration code SNC<1:n> by raising the voltage level by which the logic high value (i.e., logic "1" value) is represented from the first high voltage V1 to the second high voltage V2. As a result, each of the level shifted pull-up calibration code SPC<1:n> and the level shifted pull-down calibration code SNC<1:n> may be a digital code consisting of a plurality of binary bits, a logic high value (i.e., logic "1" value) of which is represented by the second high voltage V2.

In FIG. 6, the calibration code generator 610 may include a reference resistor leg RL, a first comparator 611, a pull-down code generator 612, a pull-down resistor leg PDL, a pull-up resistor leg PUL, a second comparator 613, and a pull-up code generator 614. The reference resistor leg RL may be coupled to the external reference resistor ZQ. The external reference resistor ZQ may be coupled to the first high voltage V1, and the reference resistor leg RL may be, for example, a pull-down resistor leg coupled to a ground voltage VSS. In an embodiment, in a case where the external reference resistor ZQ is coupled to the ground voltage VSS, the reference resistor leg RL may be a pull-up resistor leg coupled to the first high voltage V1. The first comparator 611 may compare a voltage level determined according to the resistance ratio of the external reference resistor ZQ and the reference resistor leg RL and the voltage level of a reference voltage VREF. The reference voltage VREF may have a voltage level corresponding to half the voltage level of the first high voltage V1. That is to say, the voltage level of the reference voltage VREF may be one half the voltage level of the power supply voltage of the calibration circuit 510. The pull-down code generator 612 may generate the pull-down calibration code NC<1:n> based on the comparison result of the first comparator 611. For example, the pull-down code generator 612 may increase or decrease the value of the pull-down calibration code NC<1:n> according to the comparison result of the first comparator 611. Resistance values of resistors of the pull-down resistor leg PDL may be set based on the level shifted pull-down calibration code SNC<1:n>. The pull-down resistor leg PDL may include a plurality of resistor legs, and may have a resistance value that can be changed based on the level shifted pull-down calibration code SNC<1:n>.

The pull-up resistor leg PUL may be coupled to the pull-down resistor leg PDL. The second comparator 613 may compare a voltage level determined according to the resistance ratio of the pull-up resistor leg PUL and the pull-down resistor leg PDL and the voltage level of the reference voltage VREF. The pull-up code generator 614 may generate the pull-up calibration code PC<1:n> according to the comparison result of the second comparator 613. For example, the pull-up code generator 614 may increase or decrease the value of the pull-up calibration code PC<1:n> according to the comparison result of the second comparator 613. Resistance values of resistors of the pull-up resistor leg PUL may be set based on the level shifted pull-up calibration code SPC<1:n>. The pull-up resistor leg PUL may include a plurality of resistor legs, and may have a resistance value that can be changed based on the level shifted pull-up calibration code SPC<1:n>. The calibration code generator 610 may set first the pull-up calibration code PC<1:n>, and then may set the pull-down calibration code NC<1:n> according to the set pull-up calibration code PC<1:n>. Alternatively, the calibration code generator 610 may set first the pull-down calibration code NC<1:n>, and then may set the pull-up calibration code PC<1:n> according to the set pull-down calibration code NC<1:n>.

Figure 7:
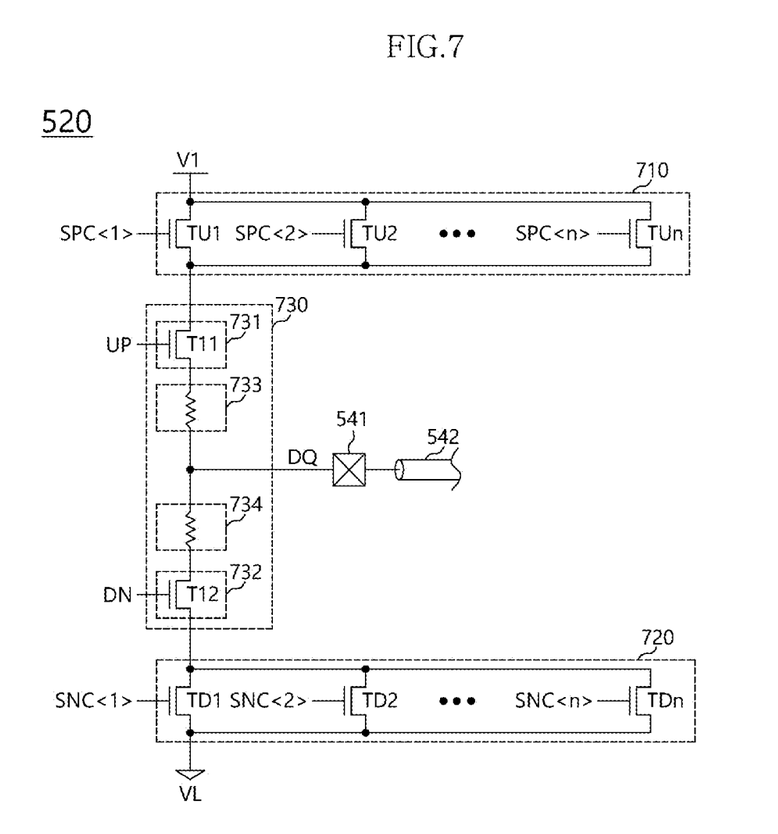
FIG. 7 is a diagram illustrating an example configuration of the output driver illustrated in FIG. 5.

FIG. 7 is a diagram illustrating an example configuration of the output driver 520 illustrated in FIG. 5. The output driver 520 may generate the output data DQ by driving the data transmission line 542 based on the data DATA. The output driver 520 may operate by using the first high voltage V1, and may generate the output data DQ having a voltage level between the first high voltage V1 and a low voltage VL. The low voltage VL may be, for example, the ground voltage VSS. The resistance value of the output driver 520 may be set based on the level shifted pull-up calibration code SPC<1:n> and the level shifted pull-down calibration code SNC<1:n>. In FIG. 7, the output driver 520 may include a pull-up resistor leg 710, a pull-down resistor leg 720, and a data driver 730. The pull-up resistor leg 710 may be coupled between the terminal of the first high voltage V1 and the data driver 730. The pull-up resistor leg 710 may have a resistance value that can be changed based on the level shifted pull-up calibration code SPC<1:n>. The pull-up resistor leg 710 may include a plurality of resistor legs coupled between the terminal of the first high voltage V1 and the data driver 730. The pull-up resistor leg 710 may be configured in substantially the same way as the pull-up resistor leg PUL of FIG. 6. That is to say, the pull-up resistor leg PUL may be a replica resistor of the pull-up resistor leg 710. The plurality of resistor legs of the pull-up resistor leg 710 may be turned on in response to the respective bits of the level shifted pull-up calibration code SPC<1:n>. The pull-down resistor leg 720 may be coupled between the data driver 730 and the terminal of the low voltage VL. The pull-down resistor leg 720 may have a resistance value that can be changed based on the level shifted pull-down calibration code SNC<1:n>.

The pull-down resistor leg 720 may include a plurality of resistor legs coupled between the data driver 730 and the terminal of the low voltage VL. The pull-down resistor leg 720 may be configured in substantially the same way as the pull-down resistor leg PDL of FIG. 6. That is to say, the pull-down resistor leg PDL may a replica resistor of the pull-down resistor leg 720. The plurality of resistor legs of the pull-down resistor leg 720 may be turned on in response to the respective bits of the level shifted pull-down calibration code SNC<1:n>.

The data driver 730 may be coupled to the data transmission line 542 through the data pad 541, and may be coupled between the pull-up resistor leg 710 and the pull-down resistor leg 720. The data driver 730 may drive the data transmission line 542 based on the data DATA. The data driver 730 may generate the output data DQ by driving the data transmission line 542. The data driver 730 may pull-up or pull-down the data transmission line 542, based on the up signal UP and the down signal DN which are generated based on the data DATA. The data driver 730 may include a pull-up driver 731 and a pull-down driver 732. The pull-up driver 731 may be coupled between the pull-up resistor leg 710 and the data transmission line 542. The pull-up driver 731 may pull the data transmission line 542 up when the up signal UP is enabled. The pull-down driver 732 may be coupled between the pull-down resistor leg 720 and the data transmission line 542. The pull-down driver 732 may pull the data transmission line 542 down when the down signal DN is enabled.

In FIG. 7, the data driver 730 may further include a first resistor element 733 and a second resistor element 734. The first resistor element 733 may be coupled between the pull-up driver 731 and the data transmission line 542. The first resistor element 733 may be coupled to the data pad 541. The second resistor element 734 may be coupled between the data transmission line 542 and the pull-down driver 732. The second resistor element 734 may be coupled to the data pad 541. The first resistor element 733 and the second resistor element 734 may be provided for electrostatic discharge (ESD) purposes.

In FIG. 7, the pull-up resistor leg 710 may include first to n^th pull-up transistors TU1, TU2, . . . , and TUn. The first to n^th pull-up transistors TU1, TU2, . . . , and TUn may be N-channel MOS transistors. The first to n^th pull-up transistors TU1, TU2, . . . , and TUn may receive the respective bits of the level shifted pull-up calibration code SPC<1:n> allocated thereto through the gates of the first to n^th pull-up transistors TU1, TU2, . . . , and TUn, and may receive the first high voltage V1 through the drains of the first to n^th pull-up transistors TU1, TU2, . . . , and TUn. Sources of the first to n^th pull-up transistors TU1, TU2, . . . , and TUn may be coupled to the pull-up driver 731. The pull-up resistor leg 710 may have a resistance value that can be changed depending on how many transistors are turned on, among the first to n^th pull-up transistors TU1, TU2, . . . , and TUn, based on the level shifted pull-up calibration code SPC<1:n>. The pull-down resistor leg 720 may include first to n^th pull-down transistors TD1, TD2, . . . , and TDn. The first to n^th pull-down transistors TD1, TD2, . . . , and TDn may be N-channel MOS transistors. The first to n^th pull-down transistors TD1, TD2, . . . , and TDn may receive the respective bits of the level shifted pull-down calibration code SNC<1:n> allocated thereto through the gates of the first to n^th pull-down transistors TD1, TD2, . . . , and TDn. Drains of the first to n^th pull-down transistors TD1, TD2, . . . , and TDn may be coupled to the pull-down driver 732, and sources of the first to n^th pull-down transistors TD1, TD2, . . . , and TDn may be coupled to the low voltage VL. The pull-down resistor leg 720 may have a resistance value that can be changed depending on how many transistors are turned on, among the first to n^th pull-down transistors TD1, TD2, . . . , and TDn, based on the level shifted pull-down calibration code SNC<1:n>. The logic high levels of the level shifted pull-up calibration code SPC<1:n> and the level shifted pull-down calibration code SNC<1:n> which control the pull-up resistor leg 710 and the pull-down resistor leg 720 may be levels higher than the power supply voltage of the output driver 520. Therefore, the output driver 520 may operate at a high speed and with low power consumption, and the loading of the data transmission line 542 may be decreased.

The pull-up driver 731 may include a first transistor T11. The first transistor T11 may be an N-channel MOS transistor. The first transistor T11 may receive the up signal UP through a gate thereof. A drain of the first transistor T11 may be coupled in common to the sources of the first to n^th pull-up transistors TU1, TU2, . . . , and TUn, and a source of the first transistor T11 may be coupled to the first resistor element 733. The pull-down driver 732 may include a second transistor T12. The second transistor T12 may be an N-channel MOS transistor. The second transistor T12 may receive the down signal DN through the gate. A drain of the second transistor T12 may be coupled to the second resistor element 734, and a source of the second transistor T12 may be coupled in common to the drains of the first to n^th pull-down transistors TD1, TD2, . . . , and TDn. In an embodiment of the present disclosure, the first and second transistors T11 and T12 may have a size smaller than the first to n^th pull-up transistors TU1, TU2, . . . , and TUn and the first to n^th pull-down transistors TD1, TD2, . . . , and TDn. The data transmission line 542 may be coupled to the pull-up resistor leg 710 and the pull-down resistor leg 720 through the pull-up driver 731 and the pull-down driver 732, instead of being coupled may directly to the pull-up resistor leg 710 and the pull-down resistor leg 720. Therefore, the data transmission line 542 does not see a high impedance. Thus, it is possible to drive the data transmission line 542 with a relatively low driving force, and the size of the first and second transistors T11 and T12 forming the pull-up driver 731 and the pull-down driver 732 may decrease. As a consequence, the output driver 520 may decrease in size by having the pull-up resistor leg 710, the pull-up driver 731, the pull-down driver 732, and the pull-down resistor leg 720, which are coupled between the first high voltage V1 and the low voltage VL.

While various embodiments have been described above, it will be understood to those skilled in the art that the embodiments described are examples only. Accordingly, the data transmission device, and the semiconductor device and system including the same described herein should not be limited based on the described embodiments.

What is claimed is:

1. A data transmission device comprising:
   a calibration circuit configured to perform a calibration operation, and generate a pull-up calibration voltage and a pull-down calibration voltage; and
   an output driver configured to receive the pull-up calibration voltage and the pull-down calibration voltage, and to drive a data transmission line based on the pull-up calibration voltage, the pull-down calibration voltage, and data,
   wherein the calibration circuit comprises:
   a calibration code generator coupled to an external reference resistor, and configured to generate a pull-up calibration code and a pull-down calibration code; and
   a calibration voltage generator configured to generate the pull-up calibration voltage based on the pull-up calibration code, and generate the pull-down calibration voltage based on the pull-down calibration code.

2. The data transmission device according to claim 1, wherein the pull-up calibration voltage and the pull-down calibration voltage are analog voltages.

3. The data transmission device according to claim 1, wherein:
   the pull-up calibration voltage and the pull-down calibration voltage have voltage levels between a high voltage and a ground voltage; and
   the high voltage has a level higher than a power supply voltage of the output driver.

4. The data transmission device according to claim 1, wherein the output driver comprises:
   a data driver configured to drive the data transmission line based on the data;
   a pull-up resistor coupled between the power supply voltage and the data driver, and having a resistance value that is changed based on the pull-up calibration voltage; and
   a pull-down resistor coupled between the data driver and the ground voltage, and having a resistance value that is changed based on the pull-down calibration voltage.

5. The data transmission device according to claim 4, wherein the data driver comprises:
   a pull-up driver configured to pull the data transmission line to a higher voltage based on an up signal generated based on the data; and
   a pull-down driver configured to pull the data transmission line to a lower voltage based on a down signal generated based on the data.

6. The data transmission device according to claim 5, wherein the data driver further comprises:
   a first resistor element coupled between the pull-up driver and the data transmission line; and
   a second resistor element coupled between the data transmission line and the pull-down driver.

7. The data transmission device according to claim 5, further comprising:
   a pre-driver configured to generate the up signal and the down signal based on the data.

8. A data transmission device with an output driver comprising:
   a pull-up resistor coupled to a power supply voltage, receiving a pull-up calibration voltage, and having a resistance value that is changed based on the pull-up calibration voltage;
   a pull-down resistor coupled to a low voltage, receiving a pull-down calibration voltage, and having a resistance value that is changed based on the pull-down calibration voltage;
   a data driver coupled between the pull-up resistor and the pull-down resistor, and configured to drive a data transmission line based on data; and
   a calibration circuit coupled to an external reference resistor, and configured to generate the pull-up calibration voltage and the pull-down calibration voltage,
   wherein the calibration circuit comprises:

a calibration code generator coupled to the external reference resistor, and configured to generate a pull-up calibration code and a pull-down calibration code; and a calibration voltage generator configured to generate the pull-up calibration voltage based on the pull-up calibration code, and generate the pull-down calibration voltage based on the pull-down calibration code.

9. The data transmission device according to claim 8, wherein the pull-up calibration voltage and the pull-down calibration voltage are analog voltages.

10. The data transmission device according to claim 8, wherein:
the pull-up calibration voltage and the pull-down calibration voltage have voltage levels between a high voltage and a ground voltage; and
the high voltage has a level higher than a power supply voltage of the output driver.

11. The data transmission device according to claim 8, wherein the data driver comprises:
a pull-up driver coupled between the pull-up resistor and the data transmission line, and configured to pull the data transmission line to a higher voltage based on an up signal generated based on the data; and
a pull-down driver coupled between the data transmission line and the pull-down resistor, and configured to pull the data transmission line to a lower voltage based on a down signal generated based on the data.

12. The data transmission device according to claim 11, wherein the data driver further comprises:
a first resistor element coupled between the pull-up driver and the data transmission line; and
a second resistor element coupled between the data transmission line and the pull-down driver.

13. The data transmission device according to claim 11, further comprising:
a pre-driver configured to generate the up signal and the down signal based on the data.

14. A data transmission device comprising:
a calibration circuit configured to generate a pull-up calibration code and a pull-down calibration code by performing a calibration operation, and generate a level shifted pull-up calibration code and a level shifted pull-down calibration code by level shifting the pull-up calibration code and the pull-down calibration code; and
an output driver configured to drive a data transmission line based on the level shifted pull-up calibration code, the level shifted pull-down calibration code, and data.

15. The data transmission device according to claim 14, wherein each of the pull-up calibration code and the pull-down calibration code is a digital code consisting of a plurality of bits, a logic high value of which is represented by a first high voltage, and each of the level shifted pull-up calibration code and the level shifted pull-down calibration code is a digital code consisting of a plurality of bits, the logic high value of which is represented by a second high voltage, which is higher than the first high voltage.

16. The data transmission device according to claim 14, wherein the calibration circuit comprises:
a calibration code generator coupled to an external reference resistor, and configured to generate the pull-up calibration code and the pull-down calibration code; and
a level shifter configured to generate the level shifted pull-up calibration code by level shifting the pull-up calibration code, and generate the level shifted pull-down calibration code by level shifting the pull-down calibration code.

17. The data transmission device according to claim 14, wherein the output driver comprises:
a data driver configured to drive the data transmission line based on the data;
a pull-up resistor leg coupled between a power supply voltage and the data driver, and having a resistance value that is changed based on the level shifted pull-up calibration code; and
a pull-down resistor leg coupled between the data driver and a ground voltage, and having a resistance value that is changed based on the level shifted pull-down calibration code.

18. The data transmission device according to claim 17, wherein:
the pull-up resistor leg includes a plurality of resistance legs, and the plurality of resistor legs of the pull-up resistance leg are turned on in response to respective bits of the level shifted pull-up calibration code, and
the pull-down resistor leg includes a plurality of resistance legs, and the plurality of resistor legs of the pull-down resistor leg are turned on in response to respective bits of the level shifted pull-down calibration code.

19. The data transmission device according to claim 17, wherein the data driver comprises:
a pull-up driver configured to pull the data transmission line to a higher voltage based on an up signal generated based on the data; and
a pull-down driver configured to pull the data transmission line to a lower voltage based on a down signal generated based on the data.

20. The data transmission device according to claim 19, wherein the data driver further comprises:
a first resistor element coupled between the pull-up driver and the data transmission line; and
a second resistor element coupled between the data transmission line and the pull-down driver.

21. The data transmission device according to claim 19, further comprising:
a pre-driver configured to generate the up signal and the down signal based on the data.

22. A data transmission device with an output driver comprising:
a calibration circuit configured to generate a pull-up calibration code and a pull-down calibration code by performing a calibration operation, and generate a level shifted pull-up calibration code and a level shifted pull-down calibration code by level shifting the pull-up calibration code and the pull-down calibration code;
a pull-up resistor leg coupled to a power supply voltage, and having a resistance value that is changed based on the level shifted pull-up calibration code;
a pull-down resistor leg coupled to a low voltage, and having a resistance value that is changed based on the level shifted pull-down calibration code; and
a data driver coupled between the pull-up resistor leg and the pull-down resistor leg, and configured to drive a data transmission line based on data.

23. The data transmission device according to claim 22, wherein:
the pull-up resistor leg includes a plurality of resistor legs, and the plurality of resistor legs of the pull-up resistor leg are turned on in response to respective bits of the level shifted pull-up calibration code; and the pull-down resistor leg includes a plurality of resistor legs, and the plurality of resistor legs of the pull-down resistor leg are turned on in response to respective bits of the level shifted pull-down calibration code.

24. The data transmission device according to claim 22, wherein the calibration circuit comprises:
   a calibration code generator coupled to the external reference resistor, and configured to generate the pull-up calibration code and the pull-down calibration code; and
   a level shifter configured to generate the level shifted pull-up calibration code by level shifting the pull-up calibration code, and generate the level shifted pull-down calibration code by level shifting the pull-down calibration code.

25. The data transmission device according to claim 24, wherein each of the pull-up calibration code and the pull-down calibration code is a digital code consisting of a plurality of bits, a logic high value of which is represented by a first high voltage, and each of the level shifted pull-up calibration code and the level shifted pull-down calibration code is a digital code consisting of a plurality of bits, the logic high value of which is represented by a second high voltage, which is higher than the first high voltage.

26. The data transmission device according to claim 22, wherein the data driver comprises:
   a pull-up driver coupled between the pull-up resistor leg and the data transmission line, and configured to pull the data transmission line to a higher voltage based on an up signal generated based on the data; and
   a pull-down driver coupled between the data transmission line and the pull-down resistor leg, and configured to pull the data transmission line to a lower voltage based on a down signal generated based on the data.

27. The data transmission device according to claim 26, wherein the data driver further comprises:
   a first resistor element coupled between the pull-up driver and the data transmission line; and
   a second resistor element coupled between the data transmission line and the pull-down driver.

28. The data transmission device according to claim 27, further comprising:
   a pre-driver configured to generate the up signal and the down signal based on the data.

* * * * *